United States Patent
Gattozzi

Patent Number: 5,105,098
Date of Patent: Apr. 14, 1992

[54] SUPERCONDUCTING POWER SWITCH

[75] Inventor: Angelo L. Gattozzi, Euclid, Ohio

[73] Assignee: Tyler Power Systems, Inc., Mentor, Ohio

[21] Appl. No.: 503,705

[22] Filed: Apr. 3, 1990

[51] Int. Cl.$^5$ .......................................... H03K 17/92
[52] U.S. Cl. .................................. 307/245; 505/862; 307/306
[58] Field of Search ............... 307/245, 306, 462, 476; 357/5; 505/860, 862

[56] References Cited

U.S. PATENT DOCUMENTS

| | | | |
|---|---|---|---|
| 2,666,884 | 1/1954 | Ericsson et al. | 307/306 |
| 2,913,881 | 11/1959 | Garwin | 307/245 |
| 2,935,694 | 5/1960 | Schmitt et al. | 307/306 |
| 3,093,754 | 6/1963 | Mann | 307/306 |
| 3,292,242 | 12/1966 | Giger | 307/245 |
| 3,310,767 | 3/1967 | Buchhold | 307/245 |
| 3,369,127 | 2/1968 | Kaufman et al. | 307/306 |
| 3,384,762 | 5/1968 | Mawardi | 307/245 |
| 3,437,846 | 4/1969 | Richards | 307/245 |
| 3,629,690 | 12/1971 | Massar | 307/306 |
| 3,720,847 | 3/1973 | Massar | 307/245 |
| 3,732,438 | 5/1973 | Wright, Jr. | 307/245 |
| 3,764,828 | 10/1973 | Croso et al. | 307/245 |

FOREIGN PATENT DOCUMENTS

| | | | |
|---|---|---|---|
| 2140314 | 1/1979 | Fed. Rep. of Germany | 307/245 |
| 0094530 | 5/1985 | Japan | 307/245 |

OTHER PUBLICATIONS

Flux Pumps for Use at 60 Hz, by R. Britton, pp. 681–682, 1968.

Flux Pumps and Superconducting Solenoids by Beelen, et al., Physica 31 pp. 413–443, 1965.

60 Hz Flux Pumps, by R. Britton, Presented at Summer Study of Superconducting Devices and Accelerators, Jun. 10–Jul. 19, 1968.

Flux Pumps and AC Superconducting Components, by R. Britton, et al., pp. 703–708.

High Voltage Superconducting Switch for Power Application, by Mawardi, et al. IEEE Transactions on Magnetics, vol. Mag. 19, No. 3, pp. 1067–1070, May 1983.

Superconducting Magnetic Energy Storage and Transfer, by Laquer, et al., pp. 98–101.

A Full Scale Superconducting Rectifier for Powering an MRI-Magnet by Sikkenga, et al., IEEE Transactions on Magnetics, vol. 25, No. 2, 1989.

A Two-Phase Full-Wave Superconducting Rectifier, by Ariga, et al., IEEE Trnas. on Magnetics, vol. 25, No. 2, Mar. 1989, pp. 1815–1818.

Experimental Results of Thermally Controlled Superconducting Switches for High Frequency Operation, by Mulder, et al., Trans. on Mag. vol. 24, 1988.

(List continued on next page.)

*Primary Examiner*—John Zazworsky
*Attorney, Agent, or Firm*—Fay, Sharpe, Beall, Fagan, Minnich & McKee

[57] ABSTRACT

A primary current path (10) is defined by a thin film that spirals in a helix (14) around a central axis (16). A control path (12) extends peripherally around the helix to define a peripheral control coil (18). In this manner, the primary path and the control path each generate a magnetic flux parallel to the central axis. The primary and control paths are configured such that the magnetic flux density ($B_1$) generated by the primary path is below a critical flux density ($B_c$) of the superconducting material of the primary path. However, the sum of the magnetic flux densities from the primary and control paths exceeds the critical flux density ($B_1 + B_2 > B_c$) quenching the superconductivity of the primary path. In the preferred embodiment, the superconducting film is anisotropic in that its critical flux density is smaller perpendicular to a plane of the film than parallel to the plane of the film. The primary path is defined by a helically wound film in which the plane of the film is substantially perpendicular to the central axis; whereas, the control path is defined by a film that is wound such that the plane of the film is substantially parallel to the axis. Thus, the control coil remains superconducting even when the primary path is magnetically quenched.

7 Claims, 2 Drawing Sheets

OTHER PUBLICATIONS

Thermally and Magnetically Controlled Superconducting Rectifiers, by Mulder, et al., Trans. on Mag. vol. 25, No. 2, pp. 1819-1822, Mar. 1989.

Response Timme for a High Current Superconducting Switch by Mawardi, et al. Trans, on Mag., vol. Mag-.-22, Nov. 1986, pp. 1891-1896.

Low Noise Switching of a Superconducting Circuit by A Laser Induced Weak Link, by Cunningham, et al., Trans. on Mag., vol. 25, Mar. 1989.

Further Studies of a Laser Quenched Superconducting Opening Switch, by Francavilla, et al., Trans. on Mag., vol. 25, Mar. 1989.

A Fast Operating Magnetically Controlled Switch for 1 kA by Mulder, et al. Trans. on Magnetics, vol. Mag-21, Mar. 1985.

A High-Power Magnetically Switched Superconducting Rectifier Operating at 5 Hz by Mulder, et al., Trans. or Magnetics, vol. Mag-23, Mar. 1987.

The Status, Recent Progress, and Promise of Superconducting Materials for Practical Applications, by Rowell, et al., Trans. on Mag., vol. 25, 1989.

Thermal Response of Copper Oxide Superconducting Thin Films, by M. Rizkalla Trans. on Mag., vol. 25, Mar. 1989 pp. 2567-2570.

SUPERCONDUCTING POWER SWITCH

BACKGROUND OF THE INVENTION

The present application relates to the control of superconducting current flows. The present invention finds particular application in conjunction with a solid state superconducting power switch based on the transition of the material between superconducting and normal states and will be described with particular reference thereto. It is to be appreciated, however, that the invention will find further application in superconducting control circuitry.

Superconducting materials typically have a superconducting operating region defined by temperature T, magnetic flux density B, and current density J. Outside the superconducting operating region, the material operates in a normal, resistive state. For the material to be in its superconductive operating region, the current density must be below a critical value $J^c$, the magnetic flux density below a critical value $B_c$, and the temperature below a critical value $T_c$.

A key element in the application of superconducting technology to working devices is the ability to switch the superconducting currents on and off. In an ideal switch, the "closed" state has zero resistance and the "open" state has infinite resistance. The ideal switch also accomplishes this transition in zero time and is completely lossless. In the operating region, a superconducting material has zero resistance and is lossless. In its normal resistive state, superconducting materials have a sufficiently high resistance to define an open state, although the open state does not have the ideal infinite resistance. Further, the transition between the superconductive operating region and the normal resistive state requires a finite amount of time. Thus, with superconducting materials, a "solid state" type switch can be defined merely by moving the superconducting material between its superconducting and normal states.

Heretofore, three methods have been utilized for switching the material between superconducting and resistive states. First, an excess amount of current has been injected into the superconducting material to force the current density to become larger than the critical current density $J_c$.

A second method, thermal switching, has the advantage of being simple to implement. Several techniques have been used to transfer sufficient energy to the superconductive material to raise its temperature above the critical value $T_c$ and quench the superconductivity. Most commonly, thermal switching is achieved with an auxiliary, resistive heating coil. Other techniques, such as irradiation by a laser source, may be utilized to introduce thermal energy into a limited region of the superconducting medium.

Thermal switching has several disadvantages. To close the switch and return the material to its superconducting condition, the thermal energy must be removed. Such energy removal tends to be energy consumptive and slow.

The third technique is to raise the local magnetic flux density above its critical level $B_c$. Magnetic quenching is achieved by flooding a region of the superconductor with a magnetic field that is larger than $B_c$. Most commonly, a magnetic field is generated by an external coil which can be either resistive or superconducting. Magnetic switching is advantageous relative to thermal switching in that it avoids the transfer of heat energy and is faster.

The present invention provides a new and improved magnetic switching method and apparatus.

SUMMARY OF THE INVENTION

In accordance with the present invention, a superconducting primary load conductor is configured to generate a first magnetic flux through itself. The self induced magnetic flux approaches but does not exceed the critical magnetic flux density $B_c$ through the material. A control magnetic field coil is provided adjacent the primary load conductor. The control magnetic field coil is configured to generate a second magnetic field flux through the first conductor such that the sum of the first and second magnetic flux densities is sufficiently high that it takes the primary load conductor out of its superconducting region.

In accordance with a more limited aspect of the present invention, the control coil is configured such that the first and second fluxes cancel through the second coil.

In accordance with a more specific application of the present invention, the first conductor and the control coil each define substantially concentric spiral current paths with the control coil being disposed around the primary load conductor coil.

In accordance with more limited aspects of the present invention, the above described primary load conductor and control coil assembly are combined with other components to create various superconducting switching devices, such as diodes, SCRs, TRIACs, single phase inverters, and the like.

One advantage of the present invention resides in its relative simplicity.

Other advantages of the present invention include relatively low switching currents and short switching times.

Yet another advantage of the present invention resides in its ability to operate in modes which mimic a range of conventional solid state switching devices.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
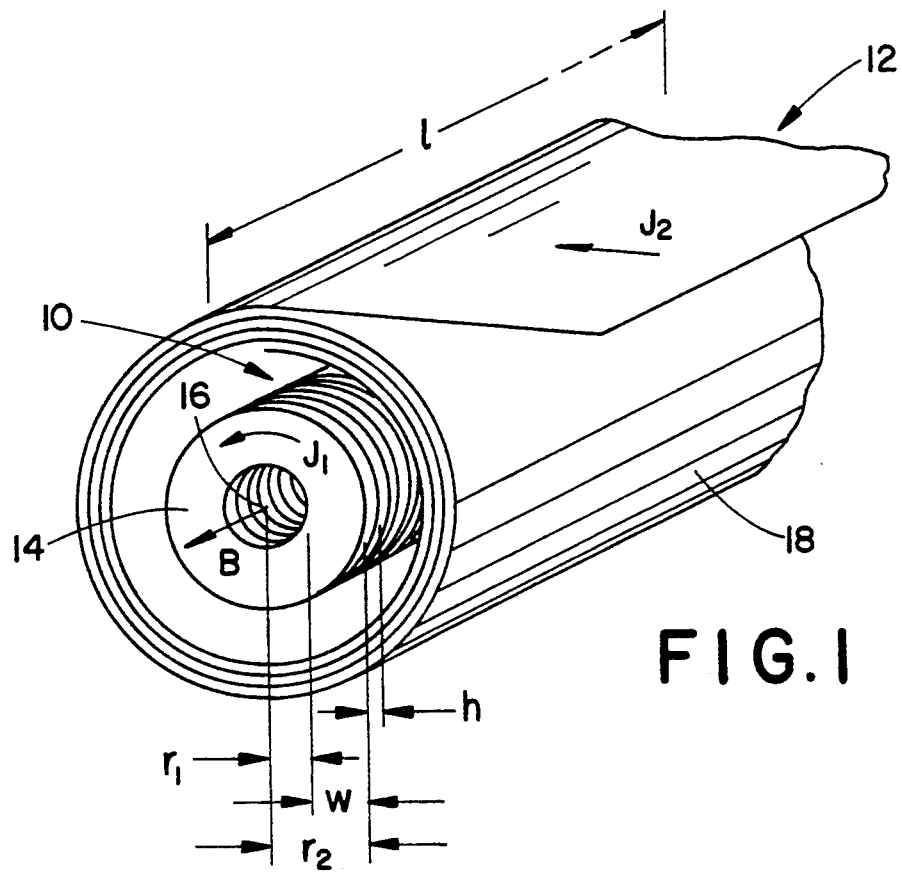
FIG. 1 is a diagrammatic illustration of a superconducting switch in accordance with the present invention.
Figure 2:
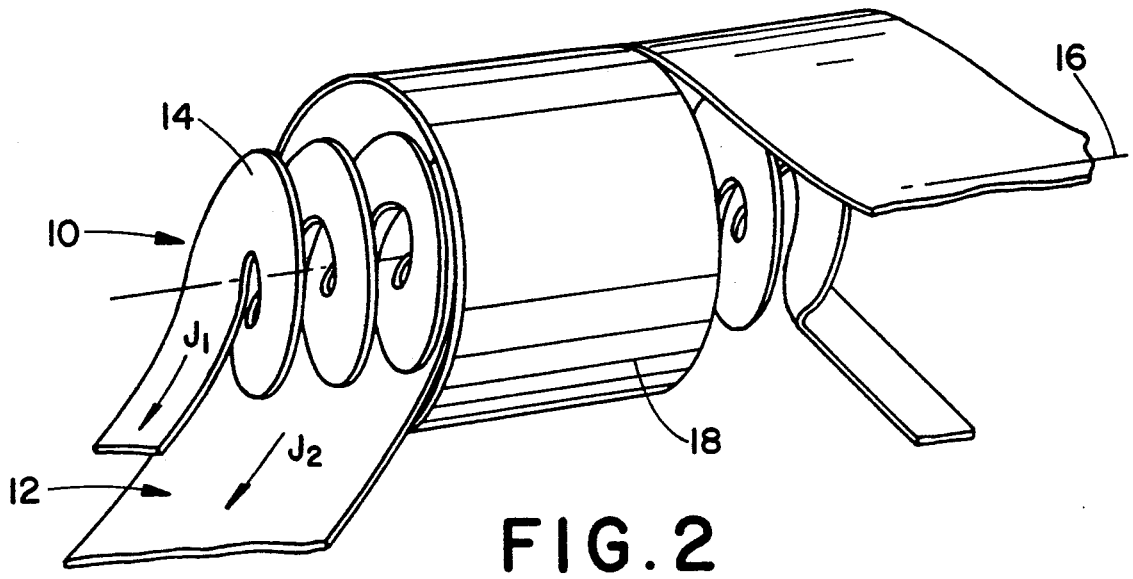
FIG. 2 is another embodiment of the switch of FIG. 1.

With reference to FIGS. 1 and 2, a first or primary current carrying path 10 is surrounded by a second or control path or means 12. The primary path 10 generates a first magnetic field with a flux density $B_1$ through itself. The control means generates a second magnetic field with a flux density $B_2$ through at least a portion of the primary path. The flux densities $B_1$ and $B_2$ are selected such that their sum exceeds the critical flux density $B_c$ of the first path extinguishing its superconductivity. Alternately, flux density $B_1$ may exceed the critical density and the second flux density $B_2$ may be subtracted such that the difference is below the critical density.

More specifically to the preferred embodiment, the primary path is defined by a superconducting film wrapped in a solenoid or helix 14 such that it generates the first magnetic field along a central axis 16 thereof. The film is thin and lies along a surface, e.g. a cylinder, that extends parallel to the central axis. The film has significant width perpendicular to the magnetic field. The primary magnetic field passes in substantial part through the primary conductor helix.

The primary path helix 14 is configured such that it generates magnetic flux with the density $B_1$ below the critical magnetic flux density $B_c$ of the superconductive film. In this manner, the primary current carrying path or conductor 10 generates a magnetic field through itself which brings the superconductive material towards, but not across, a boundary of its superconducting operating region. The flux density $B_1$ along the axis is given to a first approximation by:

$$B_1 = \mu_o Jwk \qquad (1),$$

where k is the stacking factor defined by $Nh/l$, $\mu_o$ is the magnetic susceptibility, J is the current density, w is the width of the primary path film, N is the number of turns, h is the thickness of the film and l is the length of the helix.

It is to be appreciated that the primary conductor path film may be wrapped with the plane of the film substantially perpendicular to the central magnetic flux axis, substantially parallel to the central axis, or at intermediate angles. The illustrated embodiment in which the film is disposed perpendicular to the central axis is advantageous not only in its higher flux density per unit length but also because it takes advantage of anisotropic properties of the material. For example, Y-Ba-Cu-O superconducting materials exhibit anisotropic properties. Specifically, the critical magnetic flux density $B_c$ in the plane is about 200 T; whereas, the critical flux density perpendicular to the film is about 10 T. Thus, a much lower magnetic flux density is required to extinguish the superconductivity when the flux is applied perpendicular to the film. Analogously, the critical current density $J_c$ is about $10^6$ A/cm$^2$ in the parallel plane and $10^4$ A/cm$^2$ in the direction perpendicular to the film. Resistivity (p) commonly varies between 0.050 mOhm·cm and 2 mOhm·cm with resistivity having been reported as high as 10 mOhm·cm. Other, but not necessarily all, superconducting materials evidence analogous anisotropic properties.

Using known mathematical formulas and electrical relationships, the resistance $R_1$ of the primary path helix 14 is given by:

$$R_1 = (2\pi N\rho/h)/ln(1+w/r_1) \qquad (2),$$

where $r_1$ is the inner radius of the coil.

In an example in which N=1000 turns, h=2.5 μm, w=10 mm and $r_1$=2.5 mm, the resistance is about 15,600 ohms. Analogously, the inductance $L_1$ of the primary path is given by:

$$L_1 = 2.03N^2 r_1^2 10^{-8}/(6r_1 + 9l30\ 10w) \qquad (3).$$

In the above example, the inductance is about 24.7 μH. The current carrying capacity $I_1$ is given by:

$$I_1 = Jwh \qquad (4),$$

which is about 25 amps in the above example.

For the Y-Ba-Cu-O superconducting material, the critical temperature is about 90° K., its critical current density is about 100,000 A/cm$^2$ (film) and 400 A/cm$^2$ (bulk). Its conductivity $\rho_N$ is 50–2,000 μOhm-cm. Other typical superconducting critical values are listed in Table 1 below.

TABLE 1

| Material | $T_c$ (°K) | $B_c$ (T) | $J_c$ (A/cm$^2$) | $\rho_N$ (μOhm · cm) |
|---|---|---|---|---|
| Pb (Type I) | 7 | .08 | 19,000 | .038 |
| Nb$_3$Sn(Ti) (Type II) | 18 | 26 | 10$^6$ | 10–70 |
| Y-Ba—Cu—O (High T$_c$) | 90 | 200 | 10,000 (film) 400 (bulk) | 50–2,000 |

The control means 12 includes a control coil 18 concentrically around the primary conductor helix 14. The control coil 18 is configured to generate the second magnetic field axially therethrough which adds vectorially to the first magnetic field. The second magnetic field is sufficiently large that the sum of the first and second magnetic fields exceeds the critical magnetic flux value $B_c$. In the illustrated embodiment in which the critical magnetic flux is 10 Tesla and the first magnetic flux density $B_1$ is 6 Tesla, the control coil is configured to generate a magnetic flux of about 4 Tesla.

The control coil of the preferred embodiment is a relatively wide film which wraps around the primary conductor path 10 several times. The width of the film preferably matches the length of the primary path helix. Optionally, the control coil length may exceed that of the primary path helix to control edge effects. For simplicity of operation, the control coil may receive current from the primary path helix.

By placing the control coil peripherally around the first conductor solenoid, a reduced magnetic field is achieved in the region between the two coils. That is, the primary magnetic field down the center axis of the two coils sums. However, a primary magnetic flux return path of the primary path helix 14 is defined around its periphery but inside the control coil 18. In this region, the two magnetic fields subtractively combine to create a very low magnetic flux density $B_2 - B_1$. This low flux density region inhibits the control coil from quenching its own superconductivity. Moreover, the anisotropic properties of the superconductive material are also advantageously employed in constructing the control coil. The control coil film has a high critical magnetic flux density, on the order of 200 T, parallel to the film or crystal plane. By orienting the film parallel to the magnetic fluxes, a very high density is required to quench the superconductivity in the control coil. Alternately, a non-superconducting control coil may be utilized to simplify manufacture or reduce manufacturing costs.

Figure 3:
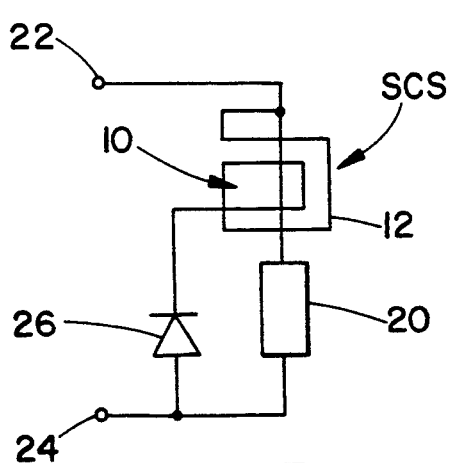
FIG. 3 is a superconducting diode incorporating the switch of FIG. 1.

With reference to FIG. 3, the superconducting switch SCS of FIG. 1 has its first or primary path 10 and a load 20 connected in series between a first terminal 22 and a second power terminal 24. One lead of the control path 12 is connected with the first terminal and the other is interconnected by a diode 26 with the second terminal. When current flows from the first terminal toward the second terminal, current flows readily through the primary path 10 and the load 20. The diode 26 prevents current flow through the control path. However, when the circuit becomes reversed biased, current tries to flow from the second terminal 24 to the first terminal 22. The diode 26 permits current flow through the control path 12 quenching superconducting current flow in the primary current path 10 preventing current from flowing through the load in the reverse direction. That is, a superconducting diode is created.

Figure 4:
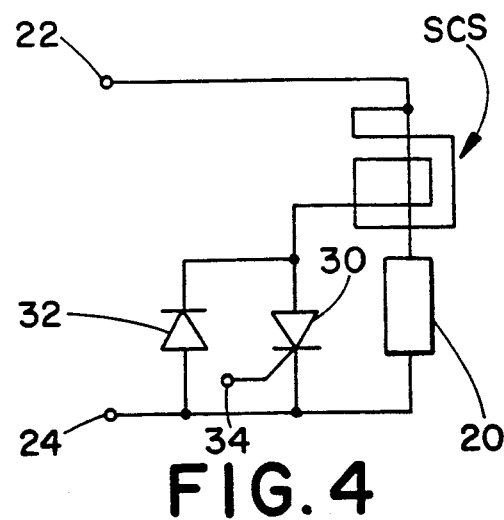
FIG. 4 is a superconducting analog of an SCR or superconducting switched rectifier.

With reference to FIG. 4, the primary conductor path 10 of the superconducting switch SCS is again connected in series with the load 20 between the power supply connections 22 and 24. One end of the control path is connected with one of the power supply connections and the other end is interconnected by an SCR 30 and a diode 32 with the other power supply connection. When terminal 22 is positive with respect to terminal 24 and a gating potential is applied to a gate 34 of the SCR, current flows through the SCR and the control path 12 quenching superconducting current flow through the primary conductor path 10. When the gate potential is removed, current flow through the control path is blocked which permits superconducting current flow through the primary path and load. When terminal 24 is positive with respect to terminal 22, the diode 32 allows current flow in the control coil which quenches the superconductivity in the main path 10 and the switch is open. In this manner, the FIG. 4 switching device functions as a superconducting switch rectifier which operates analogously to the SCR but with the "on" and "off" conditions reversed.

Figure 5:
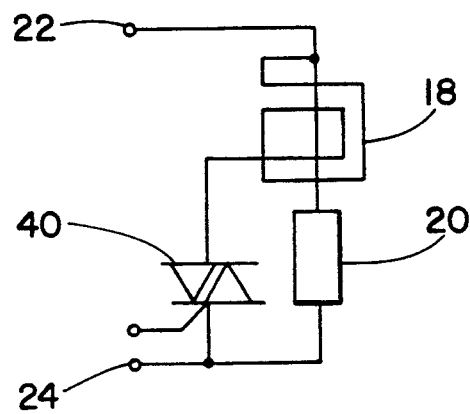
FIG. 5 is a diagrammatic illustration of a superconducting TRIAC incorporating the switch of FIG. 1.

With reference to FIG. 5, the superconducting switch SCS again has its primary current helix 14 connected in series with the load 20 across the power leads 22, 24. The control coil 18 is connected with one of the power supply leads and the other connector is connected by a TRIAC 40 to the other power supply lead. Control potentials applied to the TRIAC cause the FIG. 5 switching device to function as a superconducting TRIAC.

Figure 6:
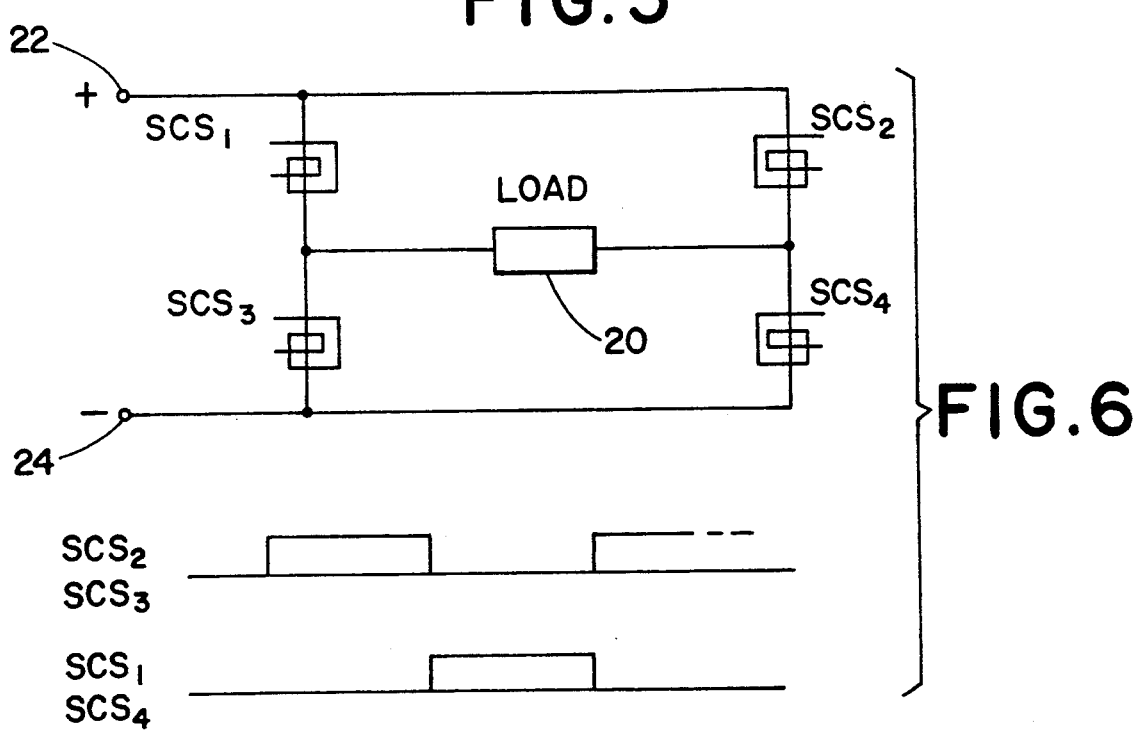
FIG. 6 is a single phase inverter incorporating four FIG. 1 switches.

With reference to FIG. 6, a first pair of superconducting switches $SCS_1$ and $SCS_2$ are interconnected with one power terminal 22 and opposite ends of the load 20. A second pair of superconducting switches $SCS_3$ and $SCS_4$ are connected between the opposite power terminal 24 and opposite ends of the load. The superconducting switches $SCS_2$ and $SCS_3$ are gated conductive as switches $SCS_1$ and $SCS_4$ are gated non-conductive. Then, switches $SCS_1$ and $SCS_4$ are gated conductive as switches $SCS_2$ and $SCS_3$ are gated non-conductive. By cyclically alternating the conductivity in this manner, the four superconducting switches function as a single phase inverter.

Obviously, modifications and alterations, including additional switching devices which can be configured will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A superconducting switching device comprising:
a primary current path extending in a helix around an axis, the primary current path including a thin film of an anisotropic superconducting material which is quenched from a superconductive state to a resistive state at a smaller critical magnetic flux density perpendicular to the superconducting material thin film and a larger critical magnetic flux density in a plane of the superconducting material thin film, the superconducting material thin film being disposed substantially perpendicular to the helix axis and spiraling peripherally therearound to generate a first magnetic flux perpendicularly through at least a portion of the superconducting material thin film in the direction of the smaller critical flux density, the first magnetic flux having a first magnetic flux density through the superconducting material thin film which is less than the smaller critical magnetic flux density, whereby superconductive current flow through the primary current path is not quenched by the first magnetic field taken alone;
a control current path extending helically around the helix axis and the primary current path helix, the control current path including a thin film of superconducting material disposed such that the thin film is oriented substantially parallel to the helix axis and extending in a helix peripherally around the primary current path helix to generate a second magnetic flux through the primary current path, the first and second magnetic fluxes summing through at least a portion of the primary current path to generate a flux density that exceeds the smaller critical magnetic flux density to quench superconducting flow through the primary current path and, the first and second magnetic fluxes subtracting in a peripheral region adjacent the control current path helix such that the control path is subject only to a small net magnetic flux density.

2. The switching device as set forth in claim 1 wherein the primary current path is connected with a switching means.

3. The switching device as set forth in claim 2 wherein the switching means is one of a diode, an SCR, and a TRIAC.

4. The switching device as set forth in claim 1 wherein the primary path and a control path are both connected at first ends to a first connection, the primary path is connected at a second end to a load which is connected with a second connection, and a second end of the control path is connected by a diode with the second connection, whereby current flowing in one direction through the primary path passes through the load and current flowing in an opposite direction through the current path is shunted at least in part by the diode through the control path creating the second magnetic field and extinguishing superconductivity through the primary path.

5. The switching device as set forth in claim 1 wherein a first end of the primary path and a first end of a control path are connected with a first connection and wherein a load is connected between a second end of the primary path and a second connection and an SCR is connected between a second end of the control path and the second connection, whereby applying a potential to a gate of the SCR quenches superconductivity of the primary path.

6. The switching device as set forth in claim 5 further including a diode connected across the SCR for passing current flow through the control coil when the connections become reverse biased blocking the primary path from being superconductive.

7. The switching device as set forth in claim 1 wherein a first end of the primary path and a first end of a control path are connected with a first connection and further including a load connection between a second end of the primary path and a second connection and a TRIAC connected between a second end of the control path and the second connection.

* * * * *